(12) United States Patent
Thorp et al.

(10) Patent No.: US 7,656,734 B2
(45) Date of Patent: Feb. 2, 2010

(54) METHODS AND APPARATUS FOR EXTENDING THE EFFECTIVE THERMAL OPERATING RANGE OF A MEMORY

(75) Inventors: Tyler Thorp, Sunnyvale, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 215 days.

(21) Appl. No.: 11/772,103

(22) Filed: Jun. 29, 2007

(65) Prior Publication Data

US 2009/0003110 A1 Jan. 1, 2009

(51) Int. Cl.
*G11C 7/04* (2006.01)
(52) U.S. Cl. .................. 365/211; 365/212; 365/63
(58) Field of Classification Search ................ 365/211, 365/212, 63
See application file for complete search history.

(56) References Cited

U.S. PATENT DOCUMENTS

| | | | |
|---|---|---|---|
| 4,899,180 A | 2/1990 | Elhatem et al. | |
| 5,659,270 A * | 8/1997 | Millen et al. ................ 331/69 |
| 6,888,750 B2 | 5/2005 | Walker et al. | |
| 7,173,407 B2 | 2/2007 | Marinca | |
| 7,403,423 B2 | 7/2008 | Marotta et al. | |
| 7,450,456 B2 * | 11/2008 | Jain et al. ................... 365/212 |
| 2009/0003109 A1 | 1/2009 | Thorp et al. | |

OTHER PUBLICATIONS

Braun et al., "On-Chip Temperature Control Circuit Using Common Devices", 2005, IEEE 2005 Custom Integrated Circuits Conference, pp. 215-218.
Office Action of U.S. Appl. No. 11/772,097, mailed May 26, 2009.
Aug. 26, 2009 Reply to May 26, 2009 Office Action of U.S. Appl. No. 11/772,097.

* cited by examiner

*Primary Examiner*—Son Dinh
*Assistant Examiner*—Nam Nguyen
(74) *Attorney, Agent, or Firm*—Dugan & Dugan, PC

(57) ABSTRACT

Systems, methods, and apparatus are provided for thermal regulation of a non-volatile memory IC. The systems and apparatus may include a thermal sensor on a memory IC; and a heating element coupled to the thermal sensor and adapted to heat the memory IC in response to a signal from the thermal sensor. The methods may include sensing a temperature of a memory IC using an integrated thermal sensor on the memory IC and heating the memory IC, using an integrated heating element operatively coupled to the thermal sensor, if the sensed temperature is below a threshold temperature.

17 Claims, 5 Drawing Sheets

US 7,656,734 B2

METHODS AND APPARATUS FOR EXTENDING THE EFFECTIVE THERMAL OPERATING RANGE OF A MEMORY

RELATED APPLICATIONS

The present application is related to commonly owned, U.S. patent application Ser. No. 11/772,097, entitled "METHODS AND APPARATUS FOR EXTENDING THE EFFECTIVE THERMAL OPERATING RANGE OF A MEMORY," filed on even date herewith and hereby incorporated herein by reference.

FIELD OF THE INVENTION

The present application relates to memories, and more specifically, the present invention relates to extending the thermal operating range of memories.

BACKGROUND

Memories used to store computer data may need to be used in environments that may not be suitable for the operation of electronic circuits. In particular, below certain thermal thresholds, electronic circuits may not function properly. Thus, what is needed are systems and methods for extending the thermal operating range of memories.

SUMMARY

In some aspects the present invention provides an apparatus for thermal regulation of a memory IC that includes a thermal sensor on a memory IC; and a heating element coupled to the thermal sensor and adapted to heat the memory IC in response to a signal from the thermal sensor.

In other aspects the present invention provides a non-volatile memory system that includes a non-volatile memory array on an IC; and a thermal regulation circuit integrated on the IC. The thermal regulation circuit is adapted to maintain the memory array at a predefined threshold temperature.

In yet other aspects the present invention provides an apparatus for thermal regulation of a non-volatile three dimensional memory IC that includes a current output temperature sensor integrated into a non-volatile three dimensional memory IC; and a resistive heating element coupled to the current output temperature sensor and adapted to heat the memory IC in response to a signal from the current output temperature sensor indicating that the memory IC is at a temperature below a desired threshold temperature.

In some other aspects the present invention provides a method of regulating the operating temperature of a memory IC that includes sensing a temperature of a memory IC using an integrated thermal sensor on the memory IC; and heating the memory IC, using an integrated heating element operatively coupled to the thermal sensor, if the sensed temperature is below a threshold temperature.

In additional aspects the present invention provides a method of operating a memory IC that includes accessing a memory IC; determining if accessing the memory IC has resulted in a number of read errors in excess of a predefined threshold; and activating a thermal regulation circuit within the memory IC if the number of read errors exceeds the predefined threshold.

In further aspects the present invention provides a method of operating a memory IC includes accessing a memory IC; determining if an uncorrectable memory read error has occurred; and activating a thermal regulation circuit within the memory IC if an uncorrectable memory read error has occurred.

In yet further aspects the present invention provides a method of operating a memory IC that includes enabling a thermal regulation circuit integrated into a memory IC; accessing the memory IC; determining if a low power consumption operating mode of the memory IC is selected; and disabling the thermal regulation circuit if the low power consumption operating mode is selected.

Other features and aspects of the present invention will become more fully apparent from the following detailed description of exemplary embodiments, the appended claims and the accompanying drawings.

DETAILED DESCRIPTION

The present invention provides systems and methods for selectively employing on-chip heating elements to extend the thermal operating range of memory integrated circuits (ICs), and in particular embodiments, the thermal operating range of non-volatile memories (e.g., non-volatile memory in a USB drive or a compact flash drive). The heating elements may be physically distributed on the memory IC and may be selectively controlled by one or more circuits adapted to receive feedback from thermal sensors that are also distributed on the memory IC. In some embodiments, the heating elements may include resistors or other components adapted to convert electrical energy into thermal energy. Likewise, temperature sensing elements such as temperature transducers (e.g., thermocouples, resistance temperature devices (RTDs), thermistors, semiconductor temperature sensors, etc.) may be adapted to convert detected thermal energy into an electrical control signal that activates the heating elements on the IC. As indicated above, the present invention effectively extends the lower thermal operating range of non-volatile memories by heating the memory elements to a operating temperature wherein the memory elements operate reliably. In particular, diodes used in non-volatile memories may be sensitive to low temperatures and the present invention may be particularly useful in compensating for diode characteristics over low temperature ranges.

In some embodiments, the present invention may be used to help overcome or correct certain error conditions. In particular, for example in low power applications, it may not be desirable, necessary, or possible to employ heating elements in a continuous manner. Therefore, in some embodiments, the use of integrated heating elements may be initiated only upon detection of an error condition and/or the availability of unlimited power (e.g., when the memory is used with a line power supply as opposed to a battery power supply). For example, temperature regulation may be employed (e.g., using the heating elements) when a number of read errors exceeds a predefined threshold or during an effort to recover from a "non-correctable" error. By limiting the use of temperature regulation using integrated, on-chip heating elements to error condition recovery and/or error avoidance, power consumption may be conserved and thereby the present invention may facilitate improving memory robustness, particularly in low power and low temperature applications.

Figure 1:
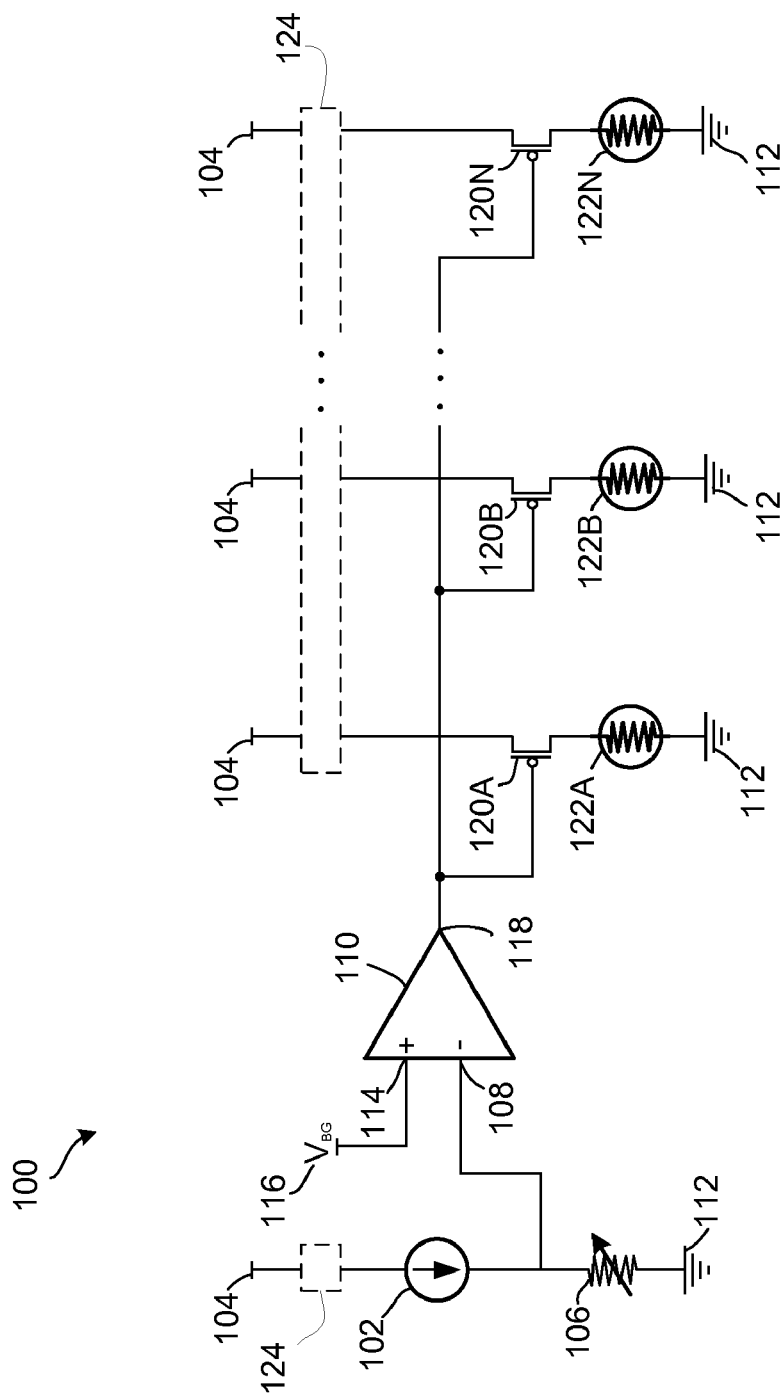
FIG. 1 is a schematic diagram depicting an example circuit operative to maintain a minimum temperature on a memory chip according to some embodiments of the present invention.

Turning now to FIG. 1, an example circuit 100 that embodies the present invention is depicted. The circuit 100 includes a current output temperature sensor 102 that has a V+ terminal coupled to a supply voltage 104 and the V− terminal coupled to both of a first end of a variable resistor 106 and the (−) terminal 108 of an operational amplifier 110. The second end of the variable resistor 106 is coupled to ground 112. The (+) terminal 114 of the operational amplifier 110 is coupled to a band gap voltage reference $V_{BG}$ 116. The output 118 of the operational amplifier 110 is coupled to each of the gates of transistors 120A, 120B, . . . , 120N. The sources of the transistors 120A, 120B, . . . , 120N are each coupled to supply voltage 104 and the drains of the transistors 120A, 120B, . . . , 120N are each coupled to resistive heating elements 122A, 122B, . . . , 122N, respectively, which are each coupled to ground 112.

In operation, variable resistor 106 is calibrated to a predefined setting that corresponds to a desired threshold temperature. For example, a resistance may be selected so that a voltage that is above the band gap voltage reference $V_{BG}$ 116 is applied to the (−) terminal 108 whenever the current output temperature sensor 102 outputs a current indicating the sensed temperature is below 55 degrees C. and so that a voltage that is below the band gap voltage reference $V_{BG}$ 116 is applied to the (−) terminal 108 whenever the current output temperature sensor 102 outputs a signal indicating the sensed temperature is above 55 degrees C. Thus, in this example, the output 118 biases the gates of transistors 120A, 120B, . . . , 120N on if the voltage applied to the (−) terminal 108 is above the band gap voltage reference $V_{BG}$ 116, indicating that the current output temperature sensor 102 is detecting a temperature less than 55 degrees C. Once the gates of transistors 120A, 120B, . . . , 120N are biased on, current flows through the transistors 120A, 120B, . . . , 120N to the respective resistive heating elements 122A, 122B, . . . , 122N which generate heat until the current output temperature sensor 102 detects that the IC is at a temperature above 55 degrees C. at which point the output of the temperature sensor 102 causes the voltage applied to the (−) terminal 108 of the operational amplifier 110 to fall below the band gap voltage reference $V_{BG}$ 116 which results in the operational amplifier 110 removing the on bias from the gates of transistors 120A, 120B, . . . , 120N and the respective resistive heating elements 122A, 122B, . . . , 122N being shut down. Thus, negative feedback is achieved via the thermal transfer from the resistive heating elements 122A, 122B, . . . , 122N to the current output temperature sensor 102.

The example circuit 100 depicts three or more resistive heating elements 122A, 122B, . . . , 122N being controlled by a single current output temperature sensor 102. Many more heating elements may be included. In some embodiments, many current output temperature sensors distributed across the memory IC may be employed. Such an embodiment facilitates accurate measurement and regulation of different parts of the IC. In addition, in some embodiments, only one or two heating elements may be coupled to a temperature sensor. In embodiments where the operating temperature of 3D memory is being regulated, the heating elements and the temperature sensors may be distributed on the same and/or different planes of the memory arrays.

The example circuit 100 described above used a current output temperature sensor as a thermal transducer. However, one of ordinary skill would recognize that many other alternative types of temperature sensors could be used. For example, voltage output sensors, Brokaw cells, bi-polar junction transistor (BJT) based temperature sensors, and discrete sensors such as thermocouples, resistance temperature devices (RTDs), and thermistors. Likewise, alternative heating elements may be employed.

In some embodiments, additional circuitry may be employed to further control the example circuit 100 described above. For example, an enable/disable function 124 (shown in phantom) may be implemented that allows the circuit 100 to be enabled or disabled based on any desired criteria. For example, the temperature sensors 102, the operational amplifier 110, and/or the heating elements 122A-N may not be powered (e.g., voltage supply 104 may be disconnected) to disable the circuit 100 and the temperature sensors 102, the operational amplifier 110, and/or the heating elements 122A-N may be powered (e.g., voltage supply 104 may be connected) to enable the circuit 100. The criteria for enabling or disabling may be implemented in a logic circuit or via a software programmable controller. Examples of the criteria may include whether the memory circuit is to operate in a low power mode and thus, thermal regulation should be disabled; whether the memory circuit is powered by a line power supply and thus, thermal regulation may be enabled; whether an error recovery mode has been initiated and thus, thermal regulation should be enabled; whether a threshold number of read errors has been detected and thus, thermal regulation should be enabled; etc. In some embodiments, control of the enable/disable function 124 may, for example, be implemented as a bit value in a configuration register and/or as a transistor switch operative to connect/disconnect the voltage supply 104 to the circuit 100. Because the heating elements may take time, for example, 10 or more microseconds, to bring the IC into the desired thermal operating range, the circuit 100 may also include a memory access delay indicator that may be used to delay memory access until the desired thermal operating range is achieved. Alternatively, upon activating the circuit 100 or a corresponding error recovery/safe mode, the host system accessing the memory may simply wait a predefined amount of time before attempting to make the memory access.

The present invention allows memories to be designed to operate within a less wide thermal range than is conventional. In other words, diodes capable of operating over a broad thermal range such as −25 degrees C. to 105 degrees C. may no longer be required for non-volatile memory applications that employ the present invention. For example, a memory employing the temperature regulating circuit 100 described above may only need to be designed to function in the thermal operating range of 55 degrees C. to 105 degrees C. as opposed to the conventional range of −25 degrees C. to 105 degrees C.

Figure 2:
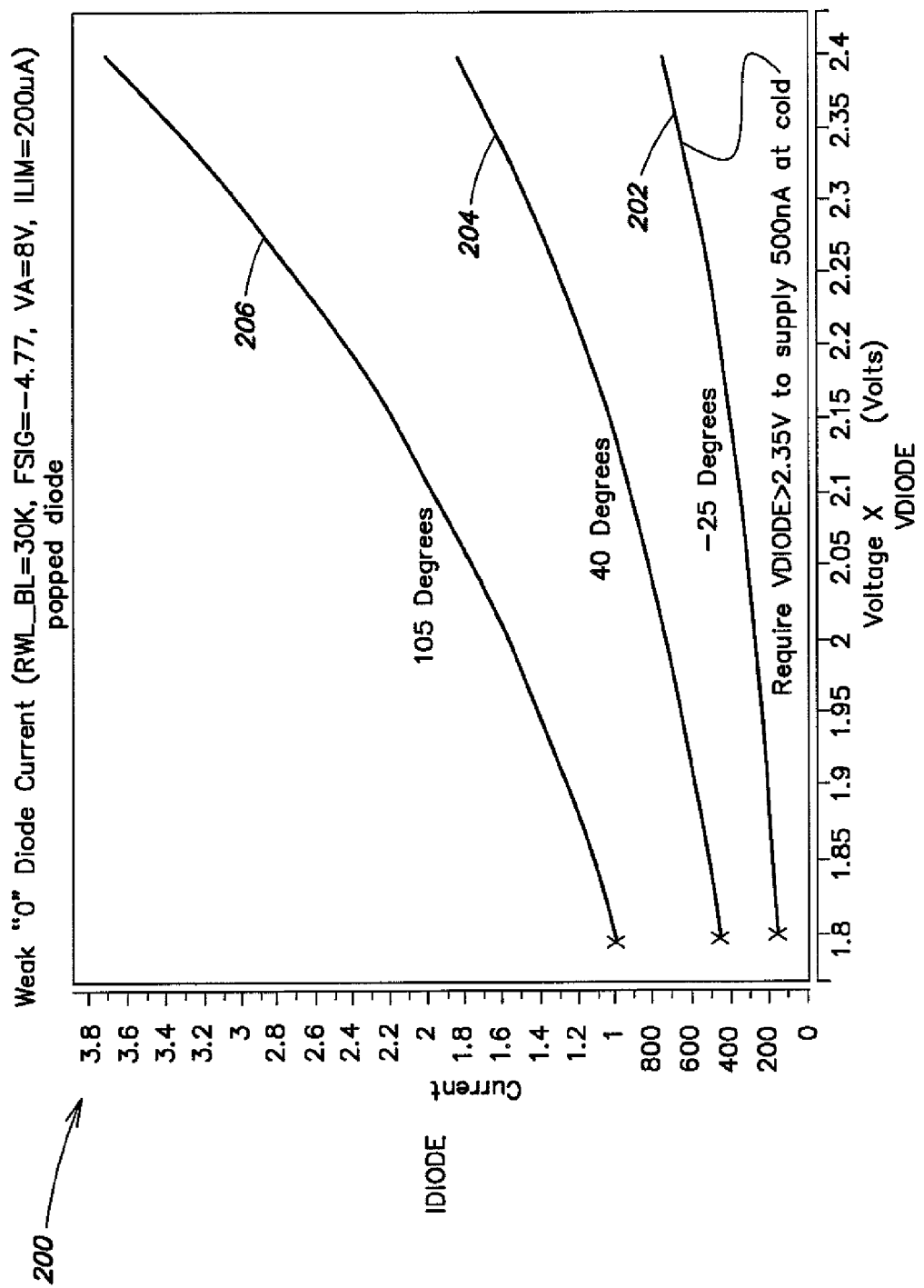
FIG. 2 is a graph illustrating example diode performance curves at different temperature levels.

Turning to FIG. 2, a graph 200 illustrating examples if diode performance curves 202, 204, 206 at different temperature levels (e.g., −25 degrees C., 40 degrees C., 105 degrees C., respectively) is provided. These diode performance curves 202, 204, 206 may be typical of diodes used in non-volatile memory cells. In the example circuit 100 described above with respect to FIG. 1, 55 degrees C. was selected as the threshold temperature below which the heating elements 122A, 122B, . . . , 122N were activated. Based on extrapolation, the graph 200 of FIG. 2 indicates that the example characterized diodes would perform acceptably at 55 degrees C. in a non-volatile memory application. It should be understood however that the example circuit 100 described above may be adapted to operate a different threshold temperatures so that any of the diode performance curves 202, 204, 206 may be selected.

Figure 3:
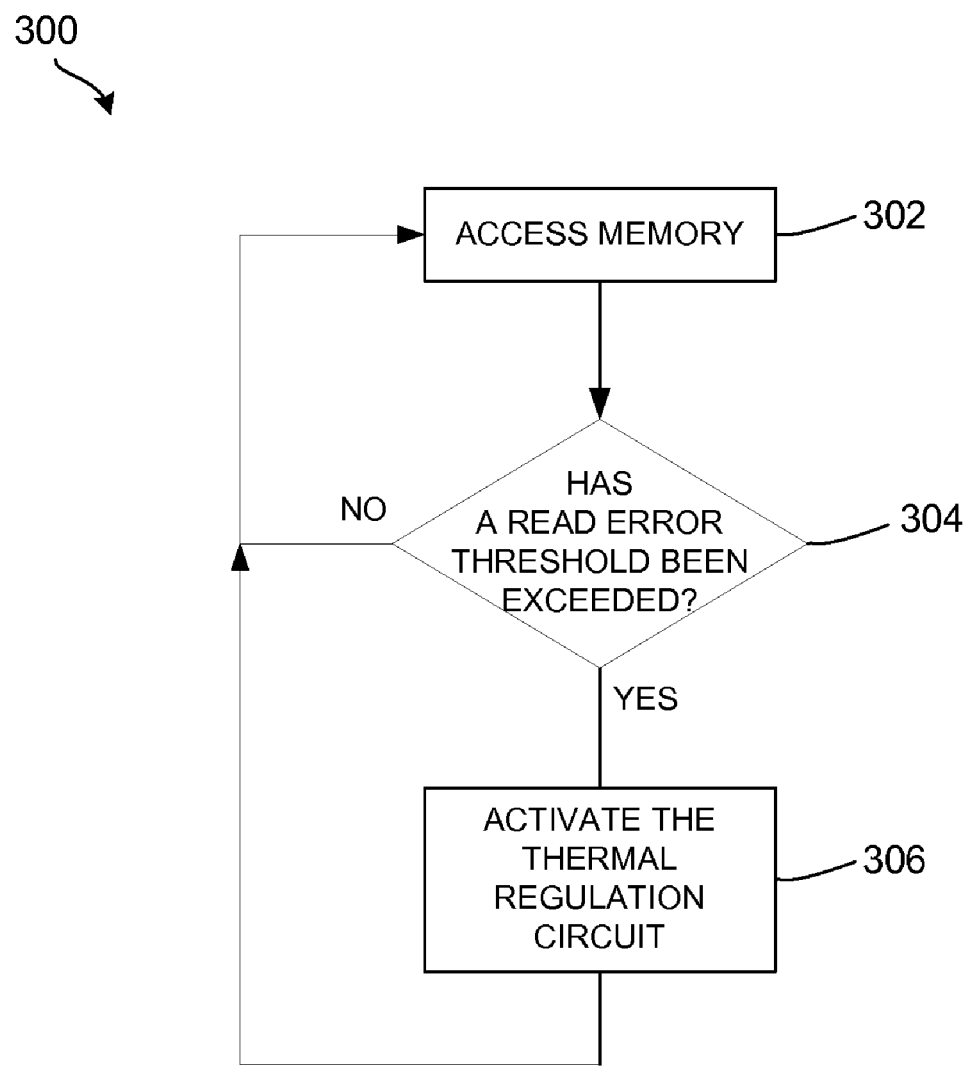
FIG. 3 is a flowchart depicting a first example method according to some embodiments of the present invention.
Figure 4:
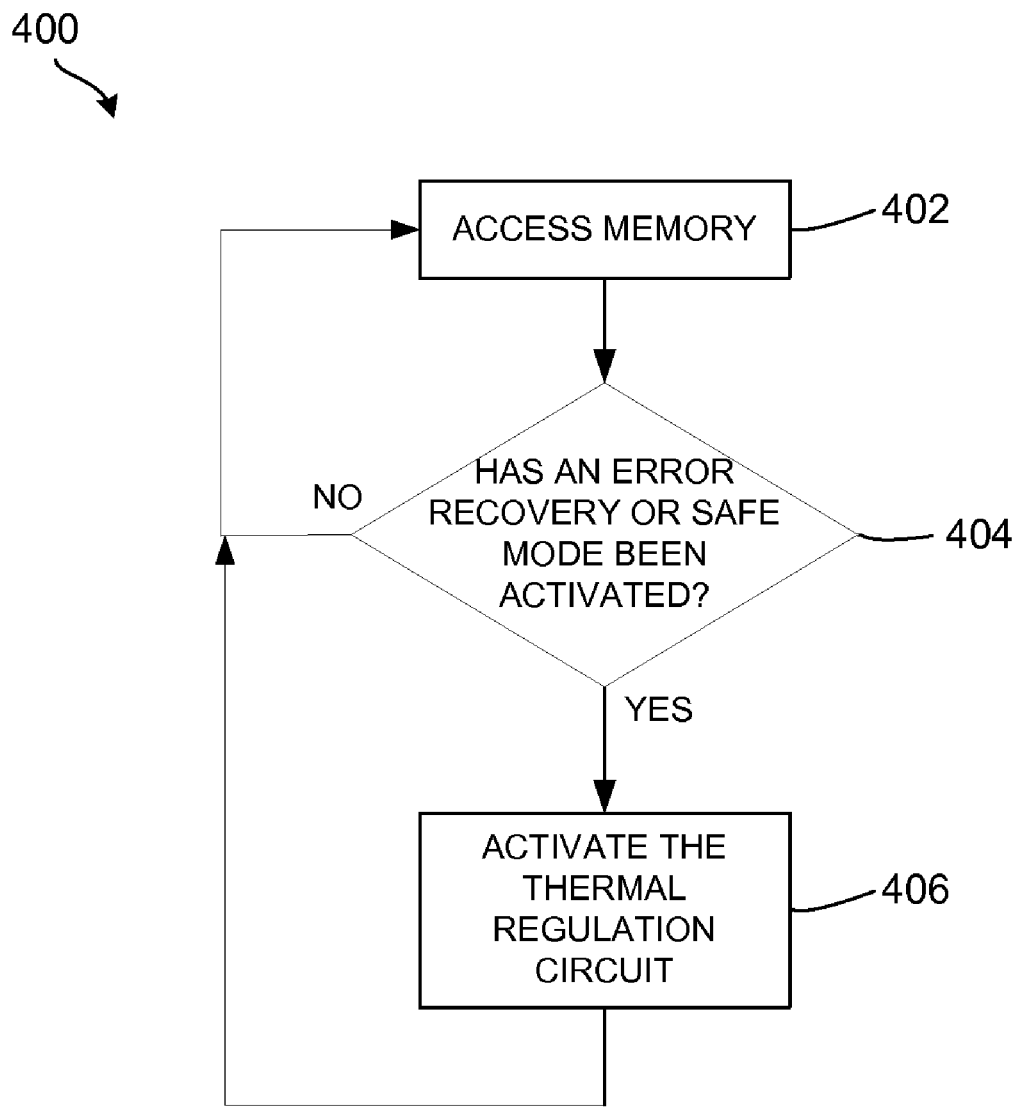
FIG. 4 is a flowchart depicting a first example method according to some embodiments of the present invention.
Figure 5:
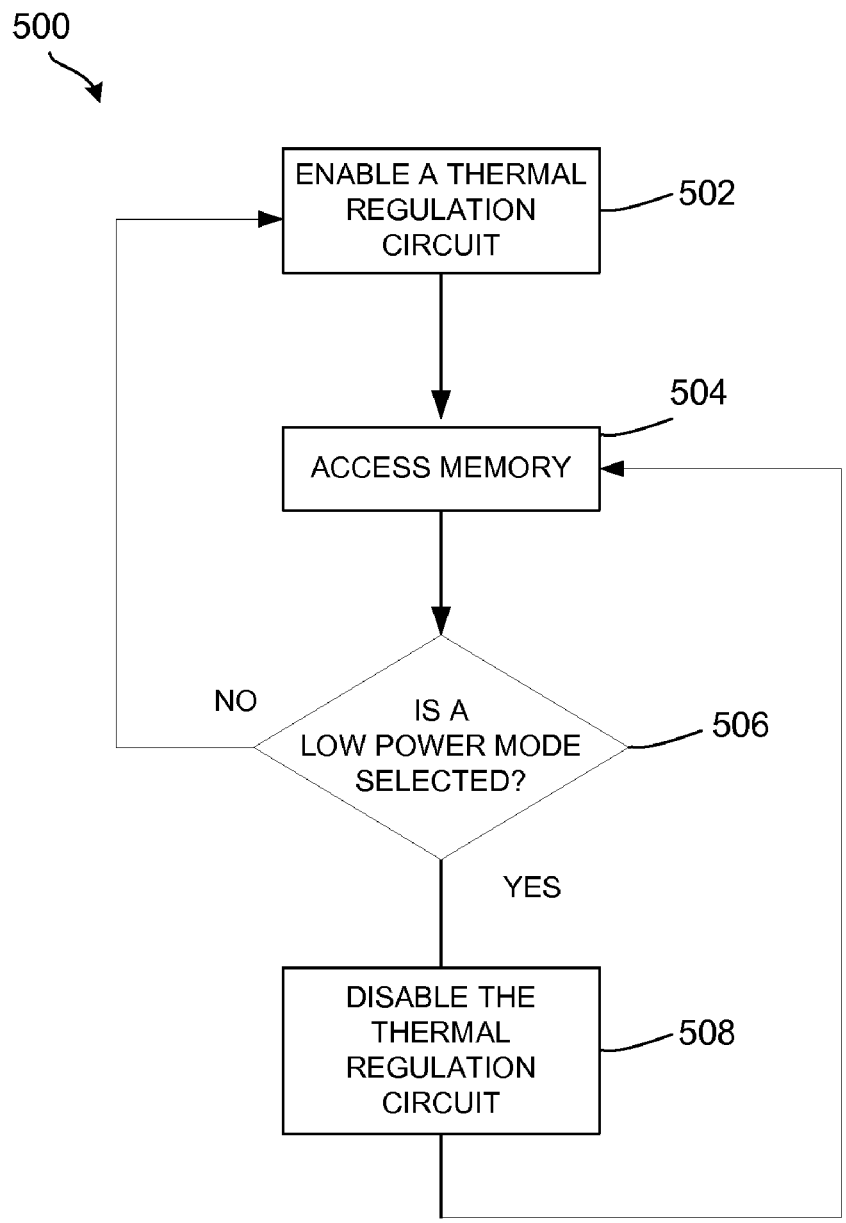
FIG. 5 is a flowchart depicting a first example method according to some embodiments of the present invention.

Turning to FIGS. 3 to 5, flowcharts illustrating example methods of the invention, including methods of using the example circuit 100 of the present invention, are described. Although specific numbers of steps are depicted in each flow chart, it should be understood that any number of steps may be employed to embody the present invention and that many additional and/or alternative steps, sub-steps, and/or compound steps may be used. In addition, the particular order of the steps depicted is merely illustrative of a possible order and it should be understood that many alternative orders of performing the steps are practicable. Finally, the various example methods may be combined into any practicable combination of methods.

In FIG. 3, a first example method 300 is depicted wherein thermal regulation (e.g., in the form of a thermal regulation circuit 100 described above) is employed if a threshold number of read errors is detected. In Step 302, memory (e.g., non-volatile memory in a USB drive or a compact flash drive) is accessed. In step 304, a determination is made whether a threshold number of errors, for example read errors, has been exceeded as a result of accessing the memory. This determination may be made based upon an error counter included in the memory circuit or by a host system accessing the memory circuit. The threshold number of errors may be a predefined number based on an expected performance of the memory, based on an acceptable rate of error for the memory design, and/or based on other factors. The errors may be detected (and corrected) through the use of well know error correction circuits (ECC) that are part of the memory circuit. If the number of errors does exceed the threshold, then in Step 306, thermal regulation may be enabled and memory access may continue by returning to Step 302. Otherwise, memory access may continue as before by returning to directly Step 302. In some embodiments, the memory access may be retried after thermal regulation is enabled in Step 306. In such a case, a delay may be introduced in Step 306, to allow the thermal regulation to become active before the retry attempt. Alternatively, ECC may be used to recover from the error and the activation of thermal regulation may be simply to reduce the possibility of errors in future memory accesses. In this case, the memory may be said to be operating in an error avoidance mode.

In FIG. 4, a second example method 400 is depicted wherein thermal regulation (e.g., in the form of using a thermal regulation circuit 100 described above) is employed if an error recovery mode or a safe mode has been activated. In some circumstances, ECC or other error detection and correction systems may be unable to correct detected errors. For example, if too many bits in an ECC set are corrupted, the ECC algorithm may be unable to determine which bits are corrupt and/or what the correct values should be. In such cases, thermal regulation may be used to attempt to recover the lost information. In Step 402, memory (e.g., non-volatile memory in a USB drive or a compact flash drive) is accessed. In step 404, a determination is made whether an uncorrectable error has occurred and whether the memory system and/or the host wants to enter an error correction or "safe" mode. A safe mode may be defined as a most reliable mode of operation, possibly achieved at the expense of performance, increased power consumption, and/or other cost. This determination may be made based upon an ECC included in the memory circuit or by a host system accessing the memory circuit. The error condition may be a predefined condition based on an expected performance of the memory, based on an acceptable rate of error for the memory design, and/or based on other factors. If an error recovery mode is to be activated, then in Step 406, thermal regulation may be enabled and memory access may be retried by returning to Step 402. Otherwise, memory access may continue as before by returning to directly Step 402. In some embodiments, a delay may be introduced in Step 406, to allow the thermal regulation to become active (e.g., a time delay to warm up the memory IC) before the retry attempt.

Turning to FIG. 5, a third example method 500 is depicted wherein thermal regulation (e.g., in the form of using a thermal regulation circuit 100 described above) is employed if power consumption is not an issue (e.g., operating on line power) and disabled if a low power application (e.g., operating on battery power) is required. In Step 502, thermal regulation is enabled. In some embodiments, a delay may be introduced in Step 502, to allow the thermal regulation to become active (e.g., a time delay to warm up the memory IC) before memory is accessed. In Step 504, memory (e.g., non-volatile memory in a USB drive or a compact flash drive) is accessed. In Step 506, a determination whether a low power consumption mode has been selected. For example, the memory system or host may determine or indicate that the memory is operating on battery power which results in a low power consumption mode being selected. If a low power consumption mode has been selected, then, in Step 508, thermal regulation is disabled and flow returns to Step 504 for memory access. If a low power consumption mode has not been selected, then, in Step 502, thermal regulation remains disabled and additional memory accesses occur in Step 504.

While the invention has been largely described with respect to the embodiments set forth above, the invention is not necessarily limited to such embodiments. For example, the instant invention can also be applied to three-dimensional memory arrays configured as a plurality of levels or planes, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; (4) the memory described in U.S. patent application Ser. No. 09/897,705, filed on Jun. 29, 2001 and entitled "Three-Dimensional Memory Array Incorporating Serial Chain Diode Stack" by Kleveland, et al.; (5) the memory described in U.S. patent application Ser. No. 11/103,249 (and related applications), filed on Mar. 11, 2005 and entitled "Word Line Arrangement Having Multi-Layer Word Line Segments for Three-Dimensional Memory Array" by Scheuerlein; and (6) the memory described in U.S. patent application Ser. No. 10/185,508, filed Jun. 27, 2002, and entitled "Three Dimensional Memory" by Cleeves, each of which is hereby incorporated herein by reference. The example temperature regulation circuit 100, or other functionally equivalent circuits, may be distributed on different levels within the three-dimensional memory. In some embodiments, for example, a plurality of heating elements, each coupled to and controlled by a single temperature sensor, may be distributed among multiple levels within the three-dimensional memory. In some embodiments, multiple sensors may control one or more heating elements on the same or different levels of the three-dimensional memory.

As used herein, the term passive element memory array (PEMA) may include a plurality of two-terminal memory cells, each connected between an associated X-line and an associated Y-line. Such a memory array may be a two-dimensional (planar) array or may be a three-dimensional array having more than one plane of memory cells. Each such memory cell may have a non-linear conductivity in which the current in a reverse direction (e.g., from cathode to anode) is less than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (e.g., write once) memory array. The memory cell may incorporate a reprogrammable memory material for which the conductivity may decrease or increase after application of a suitable electrical pulse.

Such passive element memory cells may generally be viewed as having a current steering element directing current in a direction and another component which is capable of changing its state (e.g., a fuse, an antifuse, a capacitor, a resistive element, etc.). In certain embodiments of the present invention, the memory element is a diode-like structure having a p+ region separated from an n− region by an antifuse element. When the antifuse element is programmed, the p+ region is electrically connected to the n− region and forms a diode. The programming state of the memory element may be read by sensing current flow or a voltage drop when the memory element is selected. In an organic passive element memory cell array embodiment, the memory element is a diode-like structure having an anode region separated from a cathode region by an organic material layer whose conductivity changes as electrons are injected into the layer. PEMAs are further described in U.S. Pat. No. 7,233,024, entitled "Three-Dimensional Memory Device Incorporating Segmented Bit Line Memory Array," and issued on Jun. 19, 2007 to Scheuerlein, et al. which is hereby incorporated herein in its entirety.

The memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Specifically an antifuse memory cell is preferred. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V ITIMTJ Non-volatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated herein by reference. Certain passive element memory cells that incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated herein by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated herein by reference. Memory cells comprising resistance change materials including Transition Metal Oxides, as described in more detail in U.S. patent application Ser. No. 11/287,452 by Herner, et al. which is hereby incorporated herein by reference, and Carbon Nano Tube layers, which may be formed as described in U.S. Patent Publication 20050269553 Sen, Rahul, et al. which is hereby incorporated herein by reference, can also be used.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. application Ser. No. 09/897,771, entitled "Method and Apparatus for Biasing Selected and Unselected Array Lines When Writing a Memory Array", by Roy E. Scheuerlein, filed on Jun. 29, 2001, and in "Three-Dimensional Memory Array Incorporating Serial Chain Diode Stack" by Kleveland, et al, U.S. patent application Ser. No. 09/897,705, filed on Jun. 29, 2001, which are both hereby incorporated herein by reference in their entirety.

In the above description, an array line is generally shared by two levels of the memory array (e.g., memory planes). Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines (e.g., which may be represented as horizontal lines) and Y-lines (e.g., which may be represented as vertical lines) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of a given word. Such various array organizations and configurations are well known in the art and the present invention is intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (e.g., multi-level) memory array, an adjacent memory plane may be connected similarly (e.g., a back-to-back diode stack memory array as described in U.S. Pat. No. 6,034,882 to Johnson, et al., referred to and previously incorporated above), or may reverse the directionality of memory cells in the adjacent plane (e.g., a serial chain diode stack memory array as described in U.S. patent application Ser. No. 09/897,705 by Kleveland, et al., referred to and previously incorporated above) so that the anode terminals are connected to bit lines and the cathode terminals to word lines. Consequently, the designations of X-lines, word lines, and row lines, and of Y-lines, bit lines, and column lines are merely illustrative of the various embodiments and should not be viewed in a restrictive sense, but rather in a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (e.g., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array may be a monolithic integrated circuit structure, rather than more than one integrated circuit device packaged together or in close proximity, or die-bonded together.

The foregoing detailed description illustrates only a few of the many possible implementations of the present invention. For this reason, the above detailed description is intended to merely be illustrative and not to be limiting. Variations and modifications of the embodiments disclosed herein may be made based on the above description as well as generally well known principles, without departing from the scope and spirit of the invention. It is only the following claims, including all equivalents, which are intended to define the scope of this invention.

What is claimed is:

1. A method of regulating the operating temperature of a memory IC, the method comprising:
   sensing a temperature of a memory IC using an integrated thermal sensor on the memory IC;
   determining if the memory IC is operating in an error recovery mode;
   enabling heating of the memory IC if the memory IC is operating in an error recovery mode; and
   heating the memory IC, using an integrated heating element operatively coupled to the thermal sensor, if the sensed temperature is below a threshold temperature.

2. The method of claim 1 further comprising:
   determining if the memory IC is operating in a low power consumption mode; and
   disabling heating of the memory IC if the memory IC is operating in a low power consumption mode.

3. A method of regulating the operating temperature of a memory IC, the method comprising:
   sensing a temperature of a memory IC using an integrated thermal sensor on the memory IC;
   determining if the memory IC is operating in an error avoidance mode;
   enabling heating of the memory IC if the memory IC is operating in an avoidance recovery mode; and
   heating the memory IC, using an integrated heating element operatively coupled to the thermal sensor, if the sensed temperature is below a threshold temperature.

4. A method of operating a memory IC comprising:
   accessing a memory IC;
   determining if accessing the memory IC has resulted in a number of read errors in excess of a predefined threshold by counting a number of times an error correcting circuit recovered a value attempted to be read from the memory IC; and
   activating a thermal regulation circuit within the memory IC if the number of read errors exceeds the predefined threshold.

5. The method of claim 4 wherein accessing a memory IC includes reading a location within the memory IC.

6. The method of claim 4 wherein activating a thermal regulation circuit includes sensing a temperature of the memory IC and employing at least one heating element to raise a temperature of the memory IC to a predefined temperature threshold.

7. The method of claim 6 wherein sensing a temperature includes using at least one current output temperature sensor, and wherein employing at least one heating element includes employing a plurality of resistive heating elements distributed on the memory IC.

8. A method of operating a memory IC comprising:
   accessing a memory IC;
   determining if an uncorrectable memory read error has occurred by determining that an error correcting circuit is unable to recover a value that was attempted to be read from the memory IC; and
   activating a thermal regulation circuit within the memory IC if an uncorrectable memory read error has occurred.

9. The method of claim 8 wherein accessing a memory IC includes reading a location within the memory IC.

10. The method of claim 8 wherein activating a thermal regulation circuit includes sensing a temperature of the memory IC and employing at least one heating element to raise a temperature of the memory IC to a predefined temperature threshold.

11. The method of claim 10 wherein sensing a temperature includes using at least one current output temperature sensor, and wherein employing at least one heating element includes employing a plurality of resistive heating elements distributed on the memory IC.

12. A method of operating a memory IC comprising:
   enabling a thermal regulation circuit integrated into a memory IC if the memory IC is in an error recovery mode or an error avoidance mode;
   accessing the memory IC;

determining if a low power consumption operating mode of the memory IC is selected; and disabling the thermal regulation circuit if the low power consumption operating mode is selected.

13. The method of claim 12 wherein enabling a thermal regulation circuit includes sensing a temperature of the memory IC and employing at least one heating element to raise a temperature of the memory IC to a predefined temperature threshold.

14. The method of claim 13 wherein sensing a temperature includes using at least one current output temperature sensor, and wherein employing at least one heating element includes employing a plurality of resistive heating elements distributed on the memory IC.

15. The method of claim 12 wherein accessing a memory IC includes reading a location within the memory IC.

16. The method of claim 12 wherein determining if a low power consumption operating mode of the memory IC is selected includes accessing a status bit indicative of an operating mode.

17. The method of claim 12 wherein disabling the thermal regulation circuit includes disconnecting at least a portion of the thermal regulation circuit from a power supply.

* * * * *